United States Patent

Deimling

[11] Patent Number: 6,025,716
[45] Date of Patent: Feb. 15, 2000

[54] MAGNETIC RESONANCE IMAGING APPARATUS AND METHOD FOR OPERATING SAME

[75] Inventor: Michael Deimling, Moehrendorf, Germany

[73] Assignee: Siemens Aktiengesellschaft, Munich, Germany

[21] Appl. No.: 09/059,253

[22] Filed: Apr. 14, 1998

[30] Foreign Application Priority Data

Apr. 29, 1997 [DE] Germany ............................. 19718129

[51] Int. Cl.⁷ .................................................. G01V 3/00
[52] U.S. Cl. ......................... 324/309; 324/307; 128/653
[58] Field of Search ................................... 324/307, 309, 324/311, 312, 314, 316, 313; 128/653

[56] References Cited

U.S. PATENT DOCUMENTS 4,707,658  11/1987  Frahm et al. .
4,818,941  4/1989   McKinnon .
4,949,042  8/1990   Kuhara et al. .
5,079,505  1/1992   Deimling et al. ....................... 324/311

OTHER PUBLICATIONS

"Simple Proton Spectroscopic Imaging," Dixon, Radiology, vol. 153, No. 1 (1984), pp. 189–194.

Comparison Between In–Phase and Opposed–Phase T1–Weighted Breath–Hold Flash Sequences for Hepatic Imaging, Rofsky et al., Journal of Computer Assisted Tomography, 20(2), 1996, pp. 230–235.

*Primary Examiner*—Christine K. Oda
*Assistant Examiner*—Brij B. Shrivastav
*Attorney, Agent, or Firm*—Hill & Simpson

[57] ABSTRACT

In a gradient echo sequence for a magnetic resonance imaging apparatus, at least two gradient echo signals are acquired between two excitation pulses due to the influence of a bipolar readout gradient. The respective echo times of the gradient echo signals are selected such that signals from atomic nuclei of different chemical bonding add in the one instance but subtract in another instance. Two images with different diagnostic content can be acquired from these two types of gradient echo signals.

7 Claims, 4 Drawing Sheets

MAGNETIC RESONANCE IMAGING APPARATUS AND METHOD FOR OPERATING SAME

BACKGROUND OF THE INVENTION

1. Field of the Invention

The present invention is directed to a nuclear magnetic resonance imaging (tomography) apparatus and to a method, in the form of a pulse sequence, for operating such an apparatus, of the type wherein "in phase" and "opposed phase" gradient echo sequences are used to produce respective images of a subject having different diagnostic content.

2. Description of the Prior Art

As is known, the nuclear magnetic resonance frequency of atomic nuclei is dependent not only on the existing magnetic field but also on the chemical bond of the respective atomic nuclei. This effect is referred to as chemical shift. For example, protons bonded to lipids have a resonant frequency that differs from the resonant frequency of water protons by the chemical shift δ of approximately 3.4 ppm. This slight frequency shift leads causes the magnetization vectors of fat and water protons to diverge after an excitation. By contrast to spin echo sequences, dephasing effects that are based on such internal interactions cannot be rephased with gradient echo sequences. For example, a pulse sequence known as the FLASH sequence, as disclosed in U.S. Pat. No. 4,707,658, is a typical representative of gradient echo sequences.

Dependent on the time at which the nuclear magnetic resonance signals are acquired, the signals of water protons and of lipid-bonded protons (referred to in brief below respectively as water signals and fat signals) can constructively or destructively superimpose within a considered voxel. The image appearance is thus critically dependent on the selected echo time of the pulse sequence. The condition wherein fat and water signals are in phase at the echo time, i.e. at the time of the signal acquisition, is referred to as "in phase" imaging; the condition wherein fat and water signals exhibit precisely opposite phases at the echo time is referred to as "opposed phase" imaging.

As explained in the article by N. Rofsky, "Comparison Between In-Phase and Opposed-Phase T1-Weighted Breath-Hold FLASH-sequences for Hepatic Imaging," Journal of Computer Assisted Tomography 20 (2), pages 230 through 235, fat infiltrations in the liver are recognized especially well in "opposed phase" imaging due to the signal loss in voxels that contain water as well as fat protons. Further, a black edge that is likewise to be attributed to the signal loss and can supply valuable diagnostic indications occurs in "opposed phase" imaging at boundary layers between water and fat. It was therefore pointed out in the above reference that "in phase" and "opposed phase" gradient echo sequences supply diagnostic information that supplement one another and that an image according to the "in phase" method and a separate image according to the "opposed phase" method should thereby be considered, for example in imaging the liver.

In order to make these images comparable, of course, no movement on the part of the examination subject should occur between the acquisition of the two images. Both images should therefore be acquired during, for example, a single breath-holding phase.

It is obvious that the probability that motion will occur between the two images, and thus the likelihood that the two images will no longer be spatially congruent, becomes greater the longer the overall data acquisition phase for the two images lasts.

U.S. Pat. No. 4,818,941 discloses a pulse sequence for generating fat and water images that is based on a gradient echo sequence with a readout gradient of alternating polarity. Raw data signals are acquired at two points in time after every excitation. These points in time are selected such that fat and water signals add at one acquisition point and subtract at the other. Pure water or fat images are respectively obtained by addition or subtraction of the data acquired in this way. The data are acquired under pulses of the readout gradient having the same polarity. At least in high-field systems with a minimum basic field strength of 1 Tesla, the pulse of opposite polarity lying between these two data acquisition pulses must exhibit extremely steep edges and a high gradient intensity so that the rephasing condition is satisfied at the predetermined readout times. These demands, however, can be realized if at all only with specially designed gradient amplifiers.

SUMMARY OF THE INVENTION

It is an object of the present invention to provide a method for operating a magnetic resonance imaging apparatus in the form of a pulse sequence wherein the entire data acquisition time for acquiring "in phase" and "opposed phase" images is optimally short and which does not place excessive demands on the design of the gradient amplifier employed.

The above object is achieved in accordance with the principles of the present invention in a magnetic resonance imaging apparatus, and in a method for operating such an apparatus, wherein atomic nuclei in an examination subject are excited by a series of excitation pulses, wherein a pre-phasing pulse, and a readout gradient composed of pulses of alternating operational signs, are emitted between two successive excitation pulses, with a gradient echo signal of a first type and a gradient echo signal of a second type being respectively acquired under successive gradient pulses of opposite operational signs of said readout gradient, wherein the echo times of the gradient echo signals of the first and second types are respectively selected so that the shift of the resonant frequencies, arising due to different chemical bonding of the atomic nuclei within each voxel, causes a signal enhancement in the gradient echo signal of the first type and causes a signal attenuation in the gradient echo signal of the second type, and wherein the raw data for producing two different images of the same imaging volume are acquired from the respective gradient echo signals of the first and second types.

Because a gradient echo signal is acquired both for the first image (for example, in phase) and the second image (for example, opposed phase) after every excitation, the data acquisition phase for the acquisition of both images is only insignificantly lengthened compared to the data acquisition phase for the acquisition of only one image. Since the gradient echo signals for the first and second images are read out under successive gradients of opposite operational signs, standard gradient intensities and gradient rise times suffice, so that conventional gradient amplifiers can be employed.

DESCRIPTION OF THE PREFERRED EMBODIMENTS

For a better understanding of the invention, the effect of the "chemical shift" shall be explained in greater detail first. The "chemical shift" is based on an interaction of the atomic nuclei with the molecular environment, and is thus determined by the chemical bond. Typically, protons that exhibit slightly different resonant frequencies in different chemical bonds are observed in nuclear magnetic resonance tomography. The frequency shift of lipid-bonded protons compared to protons of free water is of particular significance for medical applications. For lipid-bonded protons, the "chemical shift"—usually referenced with δ—compared to free water protons has a value of about 3.4 ppm, i.e. the resonant frequency ω of lipid-bonded protons is lower by $2\pi \cdot Y \cdot \delta \cdot B_0$ than that of protons in free water, given a field strength $B_0$ and a gyromagnetic constant Y. Given a field strength of, for example, $B_0=1.5$ Tesla, this difference amounts, for example, to 210 Hz. After an excitation of the nuclear spins at the time t=0, the phase $\Phi(t)$ is dependent on time according to the following equation:

$$\Phi(t)=2\pi \cdot Y \cdot \delta \cdot B_0 \, t$$

At every gradient echo time $TE=n/(Y \cdot \delta \cdot B_0)$, wherein n is whole and even-numbered, the magnetization vectors of the fat and water protons are parallel given the same magnetic field, i.e. are in phase. The spatial resolution in nuclear magnetic resonance tomography ensues with voxels as the smallest unit, i.e. a sum signal is acquired within one voxel. When a voxel contains fat as well as water protons, the maximum signal is thus obtained with the "in phase" condition on the basis of the signal addition.

When, however, n is uneven, then the vectors reside anti-parallel (opposed phase) and the signal contributions of fat and water protons subtract. When, thus, a voxel contains both fat as well as water protons, a signal attenuation occurs.

Nuclear magnetic resonance images are often acquired in the presence of the contrast agent. The signal S in the heterogeneous tissue after administration of contrast agent can generally be described as follows by:

$$S(c(t))=(1-f)M(c(t))+f M \exp(2\pi i \delta B_0 t),$$

wherein f is thereby the fraction of water and fat in the compartment with f=0 for water signals and f=1 for fat signals, c is the time-dependent contrast agent concentration, and M represents the sequence-dependent signal description. The following, for example, is valid for a FLASH sequence:

$$M(c(t)) = M_0 \cdot \frac{\sin(a)\exp(-TE/T_2^*(t))(1-\exp(-TR/T_1(t)))}{1-\cos(a)\exp(-TR/T_1(t))}.$$

Valid for $T_1$:

$$1/T_1(t)=1/T_{10}+R_1 c(t)$$

and valid for $T_2^*$:

$$1/T_2^*(t)=1/T_{20}^*+R_2 c(t);$$

$R_1$ is the $T_1$ relaxivity and $R_2$ is the $T_2$ relaxivity in [1/sec mmol/l].

Figure 1:
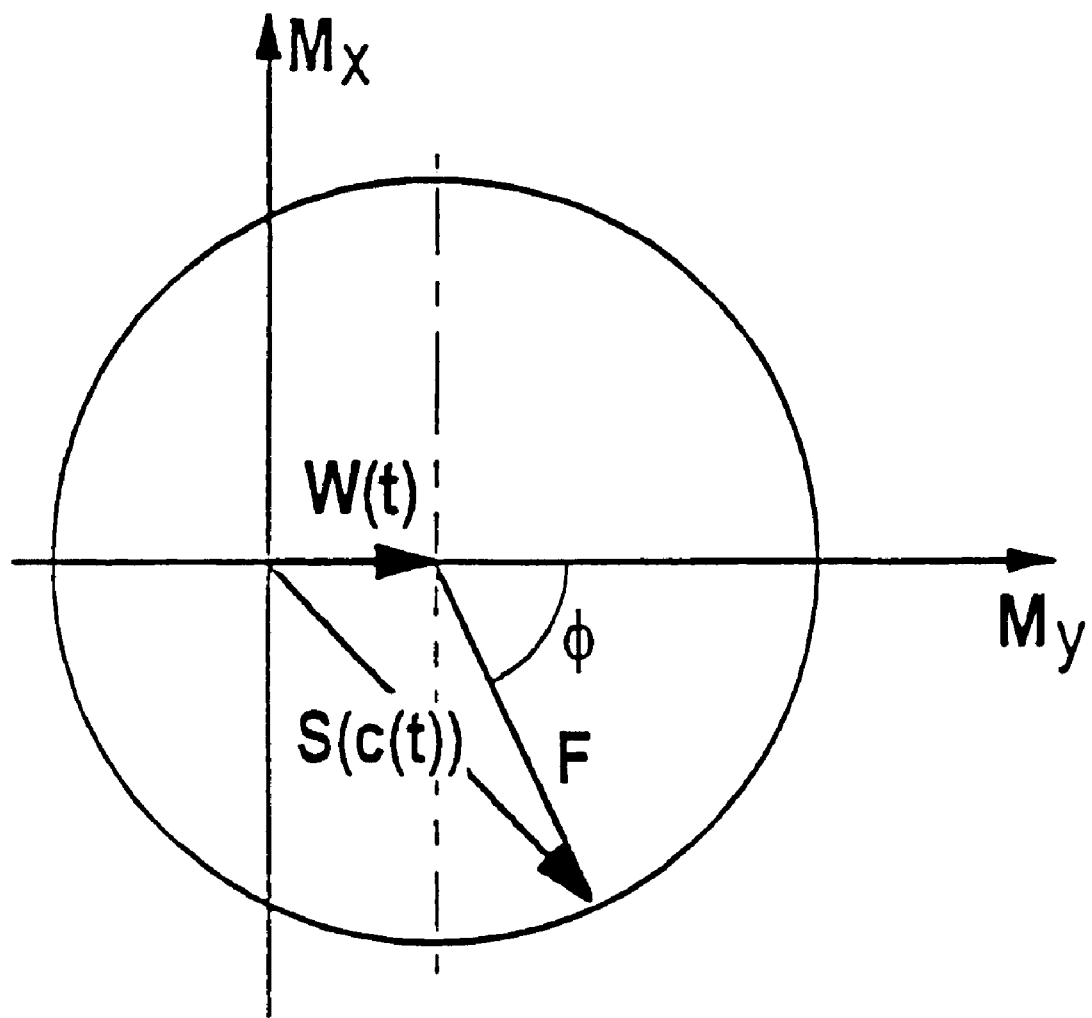
FIG. 1 is a vector diagram for showing the phase relationships for explaining "chemical shift", as background to the invention.

FIG. 1 shows the vector addition of the signal parts for a dephasing angle $\Phi$ of the fat proton signals due to the "chemical shift". The resultant, overall signal S is intensified or attenuated dependent on the dephasing angle $\Phi$.

As already mentioned, the timing of gradient echo pulse sequences can be selected such that the resultant signal for voxels, that contain atomic nuclei in different chemical bonds, is either attenuated or intensified, i.e., added or subtracted, acting in the same direction in the limit case, so that signal information of both types is obtained within one sequence repetition. This is demonstrated below with reference to an exemplary embodiment according to FIGS. 2 through 5.

Figure 2:
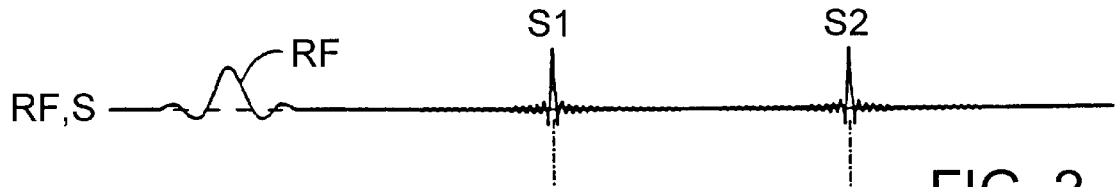
FIGS. 2–5 show a first exemplary embodiment of a pulse sequence of the invention.
Figure 3:
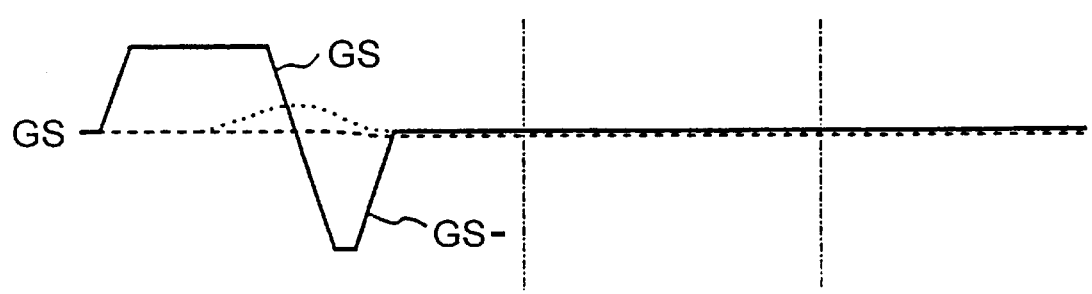

First, FIG. 2 shows an excitation pulse RF that is emitted in the presence of a slice selection gradient GS according to FIG. 3.

Figure 4:
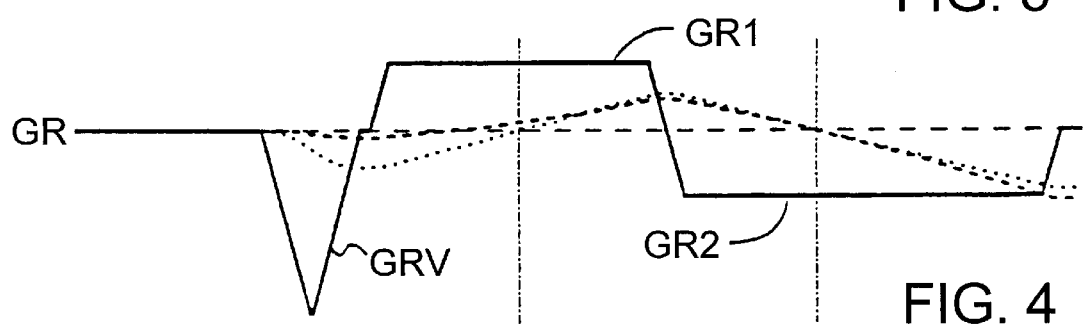
Figure 5:
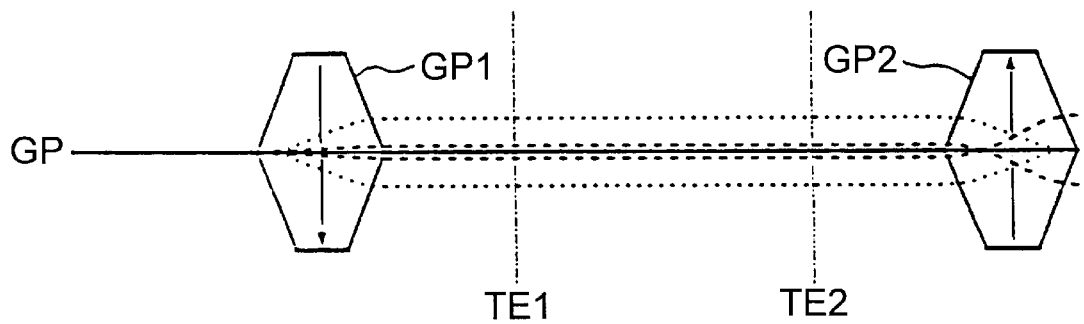
Figure 6:
FIGS. 6–9 show a second exemplary embodiment of a pulse sequence of the invention.
Figure 7:
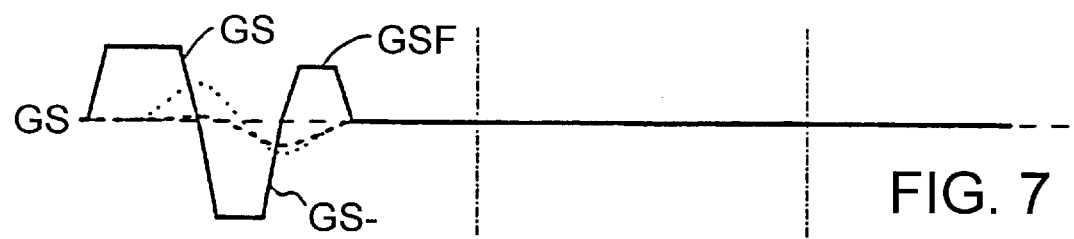
Figure 8:
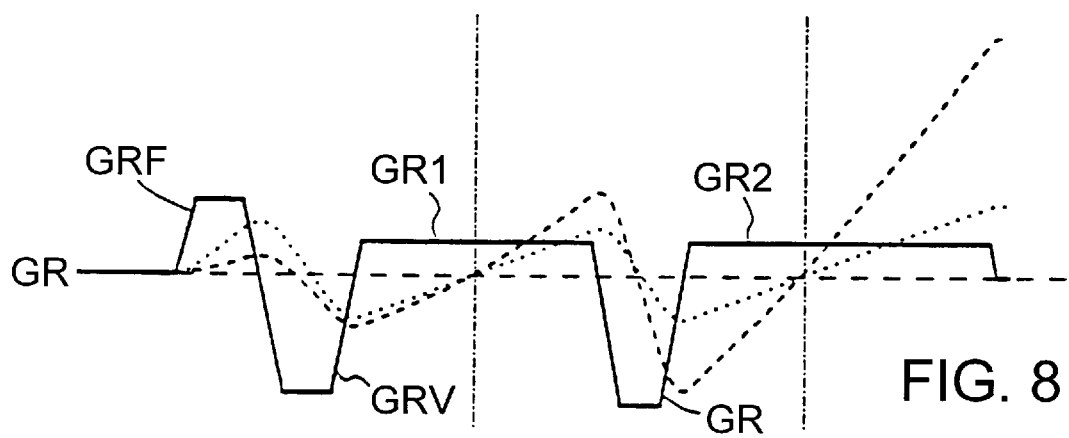
Figure 9:
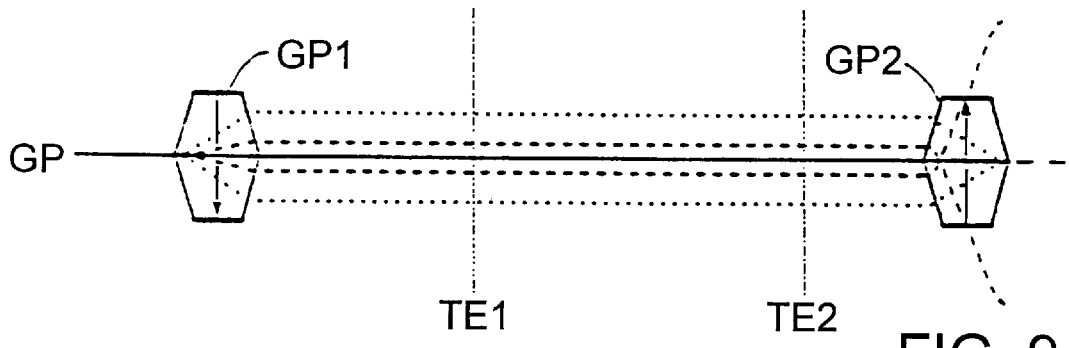

In a following time slice, a rephasing gradient GS⁻ is emitted in the opposite slice selection direction in order to in turn cancel the dephasing of the nuclear magnetic resonance signals caused with the slice selection gradient GS. According to FIG. 4, further, a pre-phasing signal $GR_v$ is activated in the negative readout direction and a first phase coding gradient GP 1 according to FIG. 5 is activated. In a third time slice, finally, a first nuclear magnetic resonance signal S1 is acquired under a first sub-pulse GR 1 in readout direction at a first echo time TE 1. Subsequently, the direction of the gradient GR is inverted in the readout direction, i.e. a second gradient pulse GR 2 is activated in the negative readout direction. As a result of the gradient inversion, a second nuclear magnetic resonance signal S 2 arises in a known way at a second echo time TE 2. Finally, the phase of the nuclear spins is reset by a second phase coding gradient GP 2 that is directed opposite the first phase coding gradient GP 1 and exhibits the same amplitude-time area. Another excitation of the nuclear spins, which is not shown in these figures, follows with a further excitation pulse after a repetition time TR.

As is generally standard in nuclear magnetic resonance tomography, the acquired signals S1 and S2 are sampled, digitized and entered in a row of a raw data matrix. The illustrated pulse sequence is repeated n times with different phase codings, i.e. different gradient time areas of the phase coding gradients GP 1 and GP 2, so that n rows of a raw data matrix are obtained.

In the illustrated exemplary embodiment, two signals S1, S2 that are entered in two different raw data matrices are acquired after every excitation pulse. The signals S1 and S2 are respectively identically locus coded within a repetition, i.e. they derive from the same slice and exhibit the same phase and readout coding.

The echo times TE 1 and TE 2 are defined by the point in time at which the nuclear magnetic resonance signals are rephased and are thus defined by the gradient time integral of the gradients GR in the readout direction. FIGS. 3 through 5 show the phase curve of the excited nuclear spins in the respective direction, whereby the phase curve for immobile spins is shown with a dotted line, the phase curve for moving spins is shown with a dashed line. One can see, first, that the spins at the echo times TE 1 and TE 2 are rephased in the slice selection direction as well as in the readout direction and exhibit the phase required for locus coding only in the phase coding direction. Due to the bipolar pulses in the readout direction, the phase at time TE 2 of the gradient echo signal is independent of whether the spins are moving. This is based on the known effect that a flux rephasing can be achieved by bipolar gradients when the following condition is satisfied:

$$\int G \cdot t \, dt = 0.$$

As explained above, the echo times TE 1 and TE 2 can be selected by the gradient curve in the readout direction such that the corresponding signals in voxels with atomic nuclei with different chemical bonding constructively superimpose in the one instance and destructively in another. For the typical application of fat and water signals, the echo times TE1 and TE2 can, for example, be selected such that fat and water signals are in phase in one instance, i.e. completely add and exhibit opposed phase in another instance, i.e. subtract.

After a short measuring time, i.e. a measuring time that is not significantly longer than that for the acquisition of a single image, two complete images are obtained according to this method, the one thereof being "in phase" and the other being "opposed phase" in the sense of the initially cited definition. Due to the short measuring time, the entire dataset for the two images typically can be measured within one held breath, so that spatially congruent images are obtained. This is important particularly given examinations in the upper abdominal area.

The diagnostic capability on the basis of two comparison images is particularly enhanced where fat and water tissue lie in close proximity. The method supplies excellent results, for example, in imaging of the liver, where a fat infiltration can be significantly more reliably determined than with only one image. The differentiation between fat and water tissue is also improved in MR mammography.

In the exemplary embodiment of FIGS. 2 through 5, the two gradient echo signals are read out under readout gradients with opposite operational signs. The spatial shift arising from the "chemical shift" is thus also oppositely directed, i.e. the part of the fat image in the first gradient echo is shifted by 2 $\delta B_0/GR$ compared to the fat image of the second gradient echo S2. Due to the high gradient intensity applied here, however, this shift given a basic field strength $B_0$ of 1.5 Tesla amounts to only 2·0.6 mm, which generally can be tolerated.

FIGS. 6 through 9 show a modification of the initial part of the pulse sequence according to FIGS. 2 through 6, wherein a flux rephasing is implemented in the direction of the readout gradient GR as well as in the direction of the slice selection gradient GS. As is known, the condition $$\int G(t) \cdot t \, dt = 0$$

must be satisfied. In order to achieve this, a gradient pulse GSF is again introduced in the positive slice selection direction in addition to the gradient pulses GS in the positive slice selection direction and GS⁻ in the negative slice selection direction. The gradient time area of this gradient pulse GSF is dimensioned such that the aforementioned condition for a flux rephasing is satisfied. In the readout direction, a gradient pulse GRF in the positive readout direction precedes the pre-phasing gradient GRV in the negative readout direction in order to satisfy the condition for a flux rephasing.

The particular contrast properties in the "opposed phase" imaging also lead to interesting results in contrast agent examinations. Due to the subtraction of signal parts fat/water in the corresponding voxels/compartments, the water compartment W becomes time-dependent in the enhancement case. In the enhancement case, a resultant signal reduction due to the subtraction of water and fat signals can even occur as a result of the signal reduction in the "opposed phase" imaging.

Figure 10:
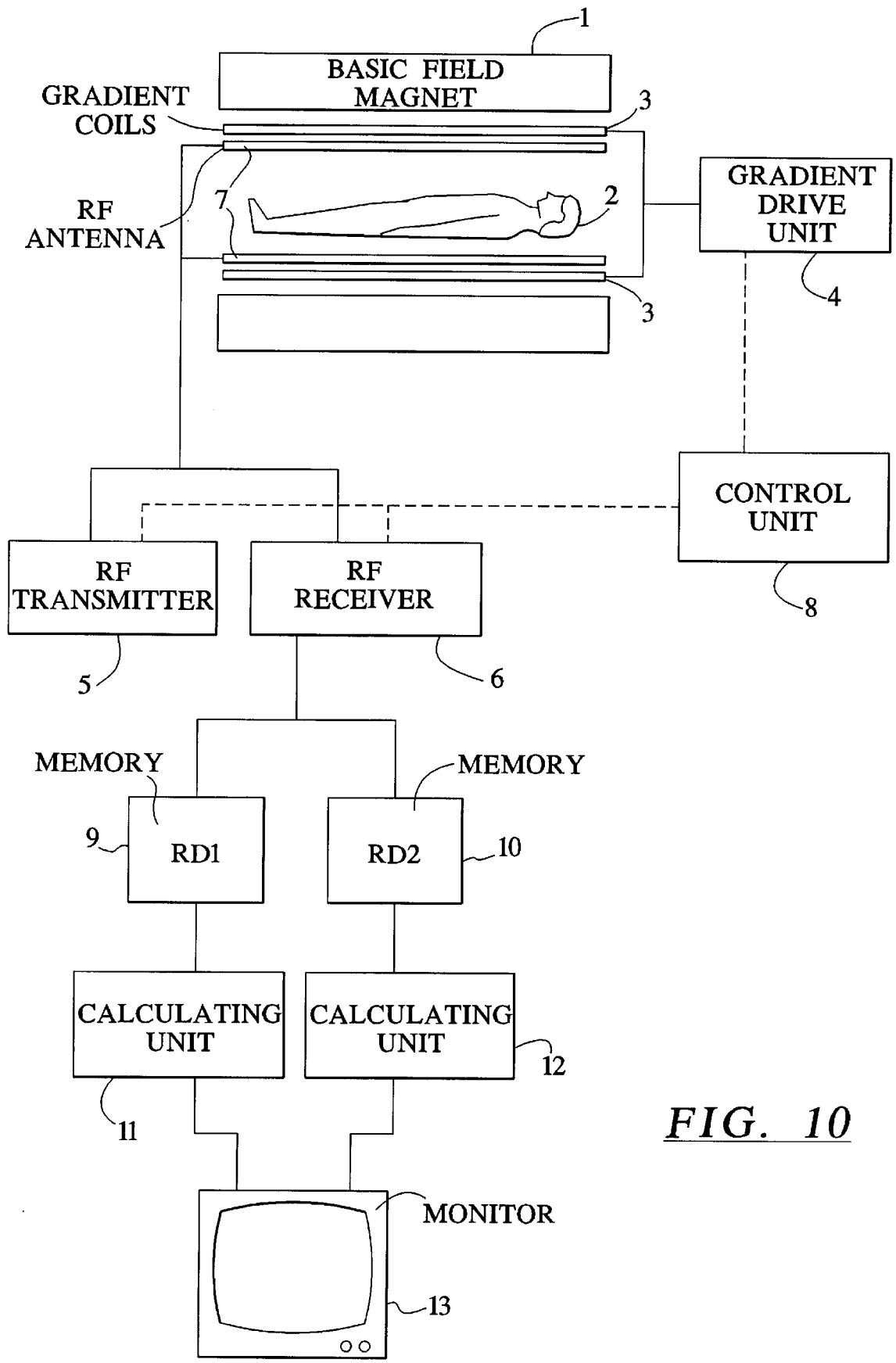
FIG. 10 shows an exemplary embodiment of a nuclear magnetic resonance tomography apparatus operable according to the inventive method.

A nuclear magnetic resonance tomography apparatus with which the inventive pulse sequence is executed is schematically shown in FIG. 10. The patient 2 is thereby located in a basic field magnet 1. Further, gradient coils 3 as well as radio-frequency antennas 7 are provided in the basic field magnet 7. The radio-frequency antennas 7 are connected to a radio-frequency transmitter 5 as well as to a reception unit 6. The gradient coils 3 are charged with current by a gradient drive unit 4. The gradient drive unit 4, the radio-frequency transmitter 5 and the radio-frequency receiver 6 are operated by a control unit 8. As a result of corresponding drive according to the above-explained pulse sequences, two types of signals are acquired in the reception unit 6, these being sampled, digitized and stored in respectively separate memories 9 and 10. Image data are acquired from the raw data RD 1 and RD 2 in the memories 9 and 10 by calculating units 11 and 12 that essentially implement a multi-dimensional Fourier transformation and a magnitude formation. These image data are separately displayed on a monitor 13.

It must be emphasized that a person skilled in the art is familiar with a number of modifications given the pulse sequences according to FIGS. 2 through 5, or 6 through 9. For example, one could alternatively excite a thicker slice instead of a thin slice in the excitation phase and, by applying an additional phase coding table in the slice selection direction, a three-dimensional dataset for this slice can be acquired. In the illustrated two-dimensional case, the excitation of one or more further slices can already ensues during the repetition time of the pulse sequence for the first slice. This technique is known as multi-slice technique. These and a number of other possible modifications shall not be discussed in detail here since they are part of the general knowledge of a person skilled in the art of MR.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance imaging apparatus comprising the steps of:

(a) emitting a plurality of successive excitation pulses and in each of said pulses exciting respective atomic nuclei participating in at least two different chemical bonds in an examination volume, said atomic nuclei which are excited by each of said pulses exhibiting at least two different resonant frequencies due to said participation in at least two different chemical bonds;

(b) between two successive excitation pulses, emitting a pre-phasing pulse and emitting a readout gradient consisting of readout pulses of alternating operational signs, and acquiring a gradient echo signal of a first type under one of said gradient pulses having a first operational sign, and obtaining a gradient echo signal of a second type under one of said gradient pulses having a second operation sign;

(c) selecting respective echo times of the gradient echo signal of the first type and the gradient echo signal of the second type so that, within each voxel, a shift of the resonant frequencies in the gradient echo signal of the first type, due to a first type of chemical bond, produces a signal enhancement, and a shift of the resonant frequencies in the gradient echo signal of the second type, due to a second chemical bond, produces signal attenuation; and (d) from said gradient echo signals of the first type and of the second type, obtaining raw data for two respectively different images of said imaging volume.

2. A method as claimed in claim 1 wherein step (b) comprises acquiring said gradient echo signals of the first and second types with signals from said atomic nuclei being in phase for one of said gradient echo signals and being in opposed phase for the other of said gradient echo signals.

3. A method as claimed in claim 1 comprising the additional step of providing both of said gradient echo signal of the first type and said gradient echo signal of the second type with the same spatial coding.

4. A method as claimed in claim 3 further comprising preceding each of said gradient echo signals by a common phase coding gradient.

5. A method as claimed in claim 3 wherein step (d) comprises producing a first raw dataset from said gradient echo signals of the first type and producing a second raw dataset from the gradient echo signals of the second type, and producing a first image dataset from said first raw dataset and producing a second image dataset, separate from said first image dataset, from said second raw dataset.

6. A method as claimed in claim 1 wherein said atomic nuclei comprise water-bonded protons and lipid-bonded protons.

7. A magnetic resonance imaging apparatus comprising:
a basic field magnet which produces a basic magnetic field in which an examination subject is disposed said examination subject continuing respective atomic nuclei participating in two different types of chemical bonds;
radio-frequency transmitter means for emitting excitation pulses into said examination subject which produce nuclear magnetic resonance signals from said nuclei:
a plurality of gradient coils, and means for driving said gradient coils for spatially coding nuclear said magnetic resonance signals arising in said examination subject;
reception means for receiving said nuclear magnetic resonance signals, including at least two memories for respectively storing at least two raw datasets; and
control means for operating said gradient drive means, said radio-frequency transmitter means and said reception means for obtaining two different types of said nuclear magnetic resonance signals with respectively different echo times under successive gradient pulses with opposite operational signs, said two different types of nuclear magnetic resonance signals respectively arising from said respective nuclei participating in said two different chemical bonds, said nuclei being simultaneously excited in each of said excitation pulses, and for storing raw datasets respectively for said two types of nuclear magnetic resonance signals respectively in said two memories, with said echo times for said two different types of nuclear magnetic resonance signals being selected for said atomic nuclei in said examination subject respectively participating in said two different chemical bonds and having a different phase relationship to each other in said different nuclear magnetic resonance signals.

* * * * *